US00RE48901E

(19) United States
(12) Reissued Patent
Verburg et al.

(10) Patent Number: US RE48,901 E
(45) Date of Reissued Patent: Jan. 25, 2022

(54) CURRENT MEASUREMENT SYSTEM

(71) Applicant: ASML Netherlands B.V., DR Veldhoven (NL)

(72) Inventors: Cor Verburg, Monster (NL); Robert Mossel, Capelle a/d Ijssel (NL); Kaustubh Prabodh Padhye, Zoetermeer (NL); Eric de Kok, Nootdorp (NL); Willem Jacob Vis, Zoetermeer (NL)

(73) Assignee: ASML Netherlands B.V., Veldhoven (NL)

(21) Appl. No.: 16/408,309

(22) Filed: May 9, 2019

Related U.S. Patent Documents

Reissue of:
(64) Patent No.: 9,644,995
Issued: May 9, 2017
Appl. No.: 13/539,585
Filed: Jul. 2, 2012

U.S. Applications:
(60) Provisional application No. 61/503,555, filed on Jun. 30, 2011.

(51) Int. Cl.
*G01D 5/24* (2006.01)
*G03F 9/00* (2006.01)

(52) U.S. Cl.
CPC ..... *G01D 5/24* (2013.01); *G03F 9/7053* (2013.01)

(58) Field of Classification Search
CPC ..... G01D 5/24; G01D 5/2417; G03F 9/7053; G01B 7/14; G01R 19/0092; G01R 15/16
(Continued)

(56) References Cited

U.S. PATENT DOCUMENTS 3,101,024 A 8/1963 Huebner
3,713,022 A 1/1973 McRay
(Continued)

FOREIGN PATENT DOCUMENTS

CN 1890880 1/2004
CN 1890880 A 1/2004
(Continued)

OTHER PUBLICATIONS

Ferran Reverter et al. "Stability and accuracy of active shielding for grounded capacitive sensors", Institute of Physics, Meas. Sci. & Tech. Sep. 28, 2006, pp. 2884-2890.

*Primary Examiner* — Kenneth Whittington
(74) *Attorney, Agent, or Firm* — Finnegan, Henderson, Farabow, Garrett & Dunner, LLP

(57) ABSTRACT

A measurement system for measuring an input electrical current (Ics) from a current source (CS) and generating a current measurement signal, comprising a current measuring circuit (70) having a first input terminal (72) connected to the current source and an output terminal (74) for providing the current measurement signal. The current measuring circuit further comprises one or more power supply terminals (75, 76) arranged to receive one or more voltages from a power supply (77a, 77b) for powering the current measuring circuit. The current measuring circuit also comprises a first voltage source (VD) coupled to the one or more power supply terminals, the first voltage source providing a disturbance voltage to the one or more power supply terminals,
(Continued)

the disturbance voltage representing a voltage at the first input terminal.

32 Claims, 12 Drawing Sheets

(58) Field of Classification Search
USPC ..... 324/662, 686, 688
See application file for complete search history.

(56) References Cited

U.S. PATENT DOCUMENTS

| | | | | |
|---|---|---|---|---|
| 4,538,069 | A | 8/1985 | Shambroom et al. | |
| 5,489,888 | A * | 2/1996 | Jagiella | G01D 3/08 324/611 |
| 5,730,165 | A | 3/1998 | Philipp | |
| 5,963,023 | A * | 10/1999 | Herrell | G06F 1/305 257/E23.067 |
| 6,014,030 | A * | 1/2000 | Smith | G01R 19/16542 320/128 |
| 6,255,842 | B1 | 7/2001 | Hashimoto | |
| 6,411,119 | B1 * | 6/2002 | Feldtkeller | G01R 31/3004 324/762.02 |
| 6,486,681 | B1 | 11/2002 | Weber et al. | |
| 6,791,314 | B1 | 9/2004 | Bortolussi | |
| 7,088,112 | B2 | 8/2006 | Yakabe | |
| 7,138,808 | B2 * | 11/2006 | Wakamatsu | G01D 5/2417 324/661 |
| 2004/0075442 | A1 * | 4/2004 | Iannello | G01D 5/24 324/632 |
| 2004/0191935 | A1 | 9/2004 | Tinnemans | |
| 2005/0002004 | A1 * | 1/2005 | Kolesnychenko | G03F 7/70341 355/30 |
| 2009/0167315 | A1 * | 7/2009 | Lindsey | G01R 31/021 324/522 |
| 2009/0237068 | A1 * | 9/2009 | Vora | G01R 21/10 324/76.11 |
| 2009/0246703 | A1 | 10/2009 | Starreveld et al. | |
| 2009/0295366 | A1 * | 12/2009 | Cehelnik | G06F 3/017 324/76.11 |
| 2010/0283539 | A1 | 11/2010 | Yanagisawa | |
| 2011/0193573 | A1 * | 8/2011 | De Boer | G01B 7/023 324/686 |
| 2011/0193574 | A1 | 8/2011 | De Boer et al. | |

FOREIGN PATENT DOCUMENTS

| | | | |
|---|---|---|---|
| CN | 1846116 | A | 10/2006 |
| CN | 101341398 | | 1/2009 |
| CN | 101341398 | A | 1/2009 |
| CN | 101490642 | | 7/2009 |
| CN | 101490642 | A | 7/2009 |
| CN | 101762736 | | 6/2010 |
| CN | 101762736 | A | 6/2010 |
| EP | 1 602 892 | | 12/2005 |
| EP | 1 602 892 | A1 | 12/2005 |
| JP | S 5728266 | | 2/1982 |
| JP | S5728266 | A | 2/1982 |
| JP | 2000-504110 | | 4/2000 |
| JP | 2000-504110 | A | 4/2000 |
| JP | 2006-006007 | | 1/2006 |
| JP | 2010-286347 | | 12/2010 |
| JP | 2011-053201 | | 3/2011 |
| JP | 2011-053201 | A | 3/2011 |
| RU | 1160321 | | 6/1985 |
| RU | 1160321 SU | | 6/1985 |
| WO | WO 2005 003688 | | 1/2005 |
| WO | WO 2005 003688 | A1 | 1/2005 |
| WO | WO 2005 036608 | | 4/2005 |
| WO | WO 2005 036608 | A2 | 4/2005 |
| WO | WO 2007 072069 | | 6/2007 |
| WO | WO 2007 072069 | A2 | 6/2007 |
| WO | WO 2008 009687 | | 1/2008 |
| WO | WO 2008 009687 | A2 | 1/2008 |

* cited by examiner

CURRENT MEASUREMENT SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATION*

*This is a reissue of U.S. Pat. No. 9,644,995, issued on May 9, 2017, from U.S. patent application Ser. No. 13/539,585, which claims the benefit of priority from U.S. patent application Ser. No. 61/503,555, filed Jun. 30, 2011. The entire contents of U.S. patent application Ser. No. 13/539,585 are incorporated herein by reference.*

BACKGROUND OF THE INVENTION

1. Field of the Invention

The present invention relates to a capacitive sensor for measuring distance, in particular capacitive sensor for measuring distance to a target in a lithography apparatus.

2. Description of the Related Art

In many applications it is important to measure an electrical current very precisely. For example, charged particle and optical lithography machines and inspection machines for example, typically require highly accurate measurement of the distance from the final lens element of the machine to the surface of a wafer or other target to be exposed or inspected. These machines and others with movable parts often require precise alignment of various parts which may be achieved by measuring distance from the moveable part to a reference point. Capacitive sensors may be used in such applications requiring fine position or distance measurement. When a capacitive sensor is energized, an electrical current flows through the sensor which varies in dependence on the distance between the sensor element and an opposing surface. A precise measurement of this current may be used to accurately determine the measured distance.

To measure an electric current, a measurement circuit may be used having the current to be measured as the input and providing a measurement signal as an output, often in the form of a voltage which may be further processed and converted to a digital signal. There are several factors which contribute to errors in such measurement circuits. These include stray impedance in the input circuitry of the measuring circuit, a limited common mode rejection ratio (CMRR) of the input circuitry, and inaccuracy on the transfer function of the measurement circuit independent of common mode. The value of such stray impedance may change, e.g. depending on factors such as temperature, and disturbances on the input may also change with time. This makes it difficult to compensate for these effects.

It is often necessary to locate the electronic measurement circuits used for driving the capacitive sensors and for generating the desired measurement signals at a distance from the sensors due to the inhospitable environment in which the sensors are located or lack of a suitable place to locate the circuits close to the sensors. In modern lithography applications such as EUV and charged particle systems, the sensors are typically located in a vacuum environment that is very sensitive to contaminants and outside disturbances, and which creates problems with heat removal from electronic circuits if they are located in the vacuum environment, and impedes access for maintenance for such circuits.

The wiring connections between the sensors and remotely located driving and measurement circuits introduce parasitic capacitances into the system which affect the reading of the sensor. If the measuring circuits could be located at the sensor probe, the sensor current could be measured directly and accurately. Because of these parallel parasitic capacitances introduced by the cabling system, measurement of current flow in the sensor is often avoided in systems with remotely located measuring circuits. Conventional solutions introduce measurement errors which need to be taken into account, usually by calibrating the combined sensor and wiring installation. The longer the wiring connection, the more severe these problems become.

The requirement to calibrate the sensors in combination with the sensor wiring reduces flexibility in designing and building sensor systems and increases their cost, and it adds a requirement for recalibration whenever a sensor or its wiring is replaced, making such a replacement complex, time-consuming, and expensive.

BRIEF SUMMARY OF THE INVENTION

The invention seeks to solve or reduce the above drawbacks to provide an improved measurement system for measuring an input electrical current from a current source and generating a current measurement signal, comprising a current measuring circuit having a first input terminal connected to the current source and an output terminal for providing the current measurement signal. The current measuring circuit further comprises one or more power supply terminals arranged to receive one or more voltages from a power supply for powering the current measuring circuit. The current measuring circuit also comprises a first voltage source coupled to the one or more power supply terminals, the first voltage source providing a disturbance voltage to the one or more power supply terminals, the disturbance voltage representing a voltage at the first input terminal.

The measurement system may further comprise a difference circuit arranged to subtract a voltage generated by the first voltage source from a signal at the output terminal of the current measuring circuit to generate the current measurement signal.

The first voltage source may be connected to the first input terminal of the current measuring circuit for driving a load to form the current source. The load may comprise a capacitive sensor for generating a current which varies in dependence on distance between the capacitive sensor and a target. The load may be connected to the first input terminal of the current measuring circuit by a cable comprising a sensor wire and a shield conductor, wherein the sensor wire is connected in series between the load and the first input terminal and the shield conductor is connected to the first voltage source.

An output terminal of the first voltage source may be coupled via one or more capacitors to the one or more power supply terminals of the current measuring circuit. The current measuring circuit may comprise a current-to-voltage converter.

The current measuring circuit may comprise an operational amplifier, a negative input terminal of the operational amplifier serving as the first input terminal of the current measuring circuit and an output terminal of the operational amplifier serving as the output terminal of the current measuring circuit, the operational amplifier further comprising a positive input terminal and one or more power supply terminals, wherein the positive input terminal of the operational amplifier is electrically connected to the one or more power supply terminals of the operational amplifier. The positive input terminal of the operational amplifier may be electrically connected to the one or more power supply terminals of the operational amplifier via one or more capacitors.

The first voltage source may be used to generate a voltage with a triangular waveform, and the current source may generate a current with a substantially square waveform.

In another aspect, the invention relates to a method for measuring an input electrical current from a current source and generating a current measurement signal. The method comprises the steps of providing the input current to a first input terminal of a current measuring circuit, the measuring circuit having one or more power supply terminals arranged to receive one or more voltages from a power supply for powering the current measuring circuit, providing a disturbance voltage to the one or more power supply terminals, the disturbance voltage representing a voltage at the first input terminal, and generating an output signal at an output terminal of the current measuring circuit representing the input electrical current at the first input terminal of the current measuring circuit.

The method may further comprise subtracting the disturbance voltage from the output signal at the output terminal of the current measuring circuit to generate the current measurement signal. The method may also comprise driving a load with a voltage to generate the input electrical current at the first input terminal of the current measuring circuit, and the load may comprise a capacitive sensor for generating a current which varies in dependence on distance between the capacitive sensor and a target.

The method may further comprise connecting the load to the first input terminal of the current measuring circuit by a cable comprising a sensor wire and a shield conductor, wherein the sensor wire is connected in series between the load and the first input terminal and the shield conductor is energized with substantially the same voltage used to drive the load.

The disturbance voltage may be provided to the one or more power supply terminals via one or more capacitors, and may be isolated from the power supply voltages by one or more inductors.

BRIEF DESCRIPTION OF THE DRAWINGS

Various aspects of the invention will be further explained with reference to embodiments shown in the drawings wherein:

FIGS. 18A-K are examples of waveforms generated in the circuit of FIG. 17.

DESCRIPTION OF ILLUSTRATIVE EMBODIMENTS

The following is a description of various embodiments of the invention, given by way of example only and with reference to the drawings.

A capacitive sensor uses a homogeneous electric field set up between two conductive surfaces. Over short distances, the applied voltage is proportional to the distance between the surfaces. Single-plate sensors measure the distance between a single sensor plate and an electrically conductive target surface.

Figure 1:
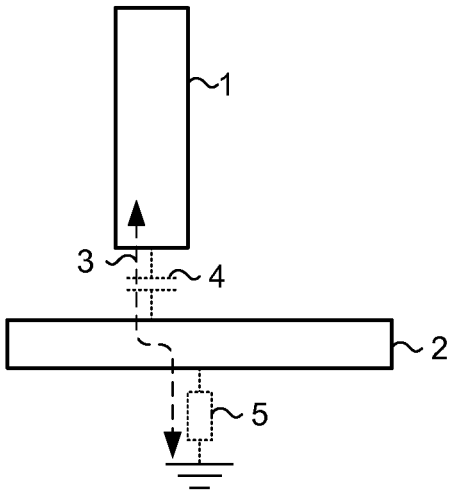
FIG. 1 is a diagram of a capacitive sensor probe and grounded conductive target.

FIG. 1 shows a single capacitive sensor probe 1 measuring the position of or separation distance to grounded conductive target 2. When supplied with an AC current, current will flow along a path 3 from the sensor to the target through the sensor-target capacitance 4, and from the target to ground through the target-ground impedance 5. The voltage across the sensor will vary in dependence on the distance separating the sensor probe and the surface of the target, and measuring this voltage will provide a measurement of target position or distance from the sensor probe to the target. The accuracy of the measurement depends on how accurately the sensor can measure the sensor-target capacitance 4.

Figure 2:
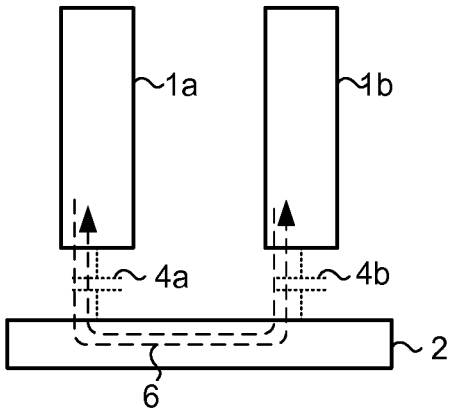
FIG. 2 is a diagram of two capacitive sensor probes in a differential measurement arrangement with a non-grounded target.

FIG. 2 shows an arrangement of two capacitive sensor probes 1a and 1b for a differential measurement of the position or separation distance to target 2. The sensors are supplied with an AC current with a phase offset of 180 degrees, so that current will flow along a path 6 from one sensor to the target through the sensor-target capacitance 4a, and from the target to the other sensor through the other sensor-target capacitance 4b. This arrangement for driving the two sensors with out-of-phase signals is effective to avoid flow of current through the target to ground, and minimizes the effect of the target to ground impedance. It is also useful for an ungrounded target as it allows current to flow from one sensor to the other without needing a grounded return path.

The capacitive sensor may be energized by an AC voltage source or AC current source, and the resulting voltage across the sensor or current through the sensor is measured. The measurement signal generated is dependent on the sensor-to-target capacitance of the sensor. The system can be calibrated to the measurement capacitor and to measure the current/voltage.

The environment in which capacitive sensors are typically applied in industrial applications is often an unsuitable location for the current or voltage source for driving the capacitive sensors and the measurement circuits for processing signals from the sensors. As a result, the driving source and measurement circuits are typically located remotely from the sensors, requiring a cable connection to the sensor. A cabling connection between the sensors and the remote circuits will introduce additional undesirable capacitances in the system, even when the cable is short.

Figure 3:
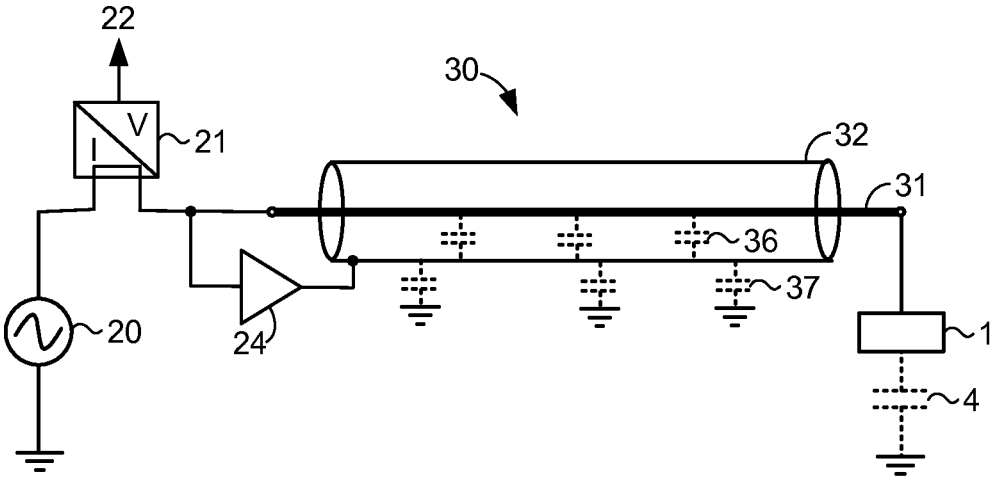
FIG. 3 is a diagram of an active guarding circuit and a coaxial cable in combination with a voltage source and current measurement circuit.

FIG. 3 is a diagram showing such a cable connection and the capacitances introduced by the cable into the sensor system. The sensor-to-target capacitance 4 is the capacitance to be measured (also referred to as the sensor capacitance), which depends on the distance between the sensor and the target. The cable 30 comprises a central conductor 31 and coaxial shield conductor 32, and the cable introduces stray capacitance 36, referred to as the cable capacitance, between the sensor wire 31 and shield 32, and stray ground capacitance 37 between the shield 32 and ground.

A voltage source 20 is connected through a current measurement circuit 21 to one end of the sensor wire 31 and the measurement electrode of the capacitive sensor is connected to the other end of the sensor wire. The voltage source 20 supplies an AC voltage to energize the capacitive sensor 1, and the current measurement circuit 21 measures the current flowing in the sensor wire 31 through the capacitive sensor 1. The current flowing through the sensor wire 31 varies in dependence on the sensor capacitance 4, which varies in dependence on the distance being measured by the sensor.

The current flowing in the sensor wire 31 will include a component due to current flowing through the sensor capacitance 4 and also a component due to current flowing through the cable capacitance 36. The cable capacitance 36 should be small in comparison to the sensor capacitance 4 because large stray capacitances increase the proportion of current flowing through the stray capacitances in comparison to the current flowing through the sensor capacitance desired to be measured, and reduces the sensitivity of the measurement. However, the cable capacitance is typically large and has an adverse effect on sensor system sensitivity.

Active guarding may be used to minimize the effect of the cable capacitance. FIG. 3 shows a conventional arrangement with a shield driver 24 comprising a unitary gain amplifier/buffer with an input connected to the end of sensor wire 31 and an output connected to shield 32. The shield driver 24 energizes shield 32 with (essentially) the same voltage as present on sensor wire 31. Since the sensor wire 31 and shield conductor 32 have almost the same voltage on them, there is only a small voltage difference between them and only a small current flow through the cable capacitance 36, and the effect of cable capacitance 36 between the conductors is reduced. In practice, the gain of the shield driver only approaches a gain of 1.0 and some deviation in the gain must be expected. Any such deviation in gain results in a small voltage difference between the shield 32 and sensor wire 31, so that there is a voltage across the cable capacitance 36. This causes a current flow through the capacitance 36 and reduces the sensitivity of the sensor system. For long cables (with higher cable capacitances) and higher measurement frequencies this arrangement becomes even less effective.

Current flow through stray cable-to-ground capacitance 37 is supplied by shield driver 24. The input current to shield driver 24 will contribute to the current measured by current measurement circuit 21 resulting in error, but the shield driver has a high input impedance and its input current is relatively small so that the resulting error is small. However, for long cables and higher measurement frequencies this arrangement is difficult to realize. The shield driver also has some input capacitance, which will draw additional current. The measured capacitance is the sum of the sensor capacitance 4 and these additional error capacitances; the deviation from unit gain of the shield driver 24 multiplied by the stray capacitance 36, and the input capacitance of the shield driver 24.

Figure 4:
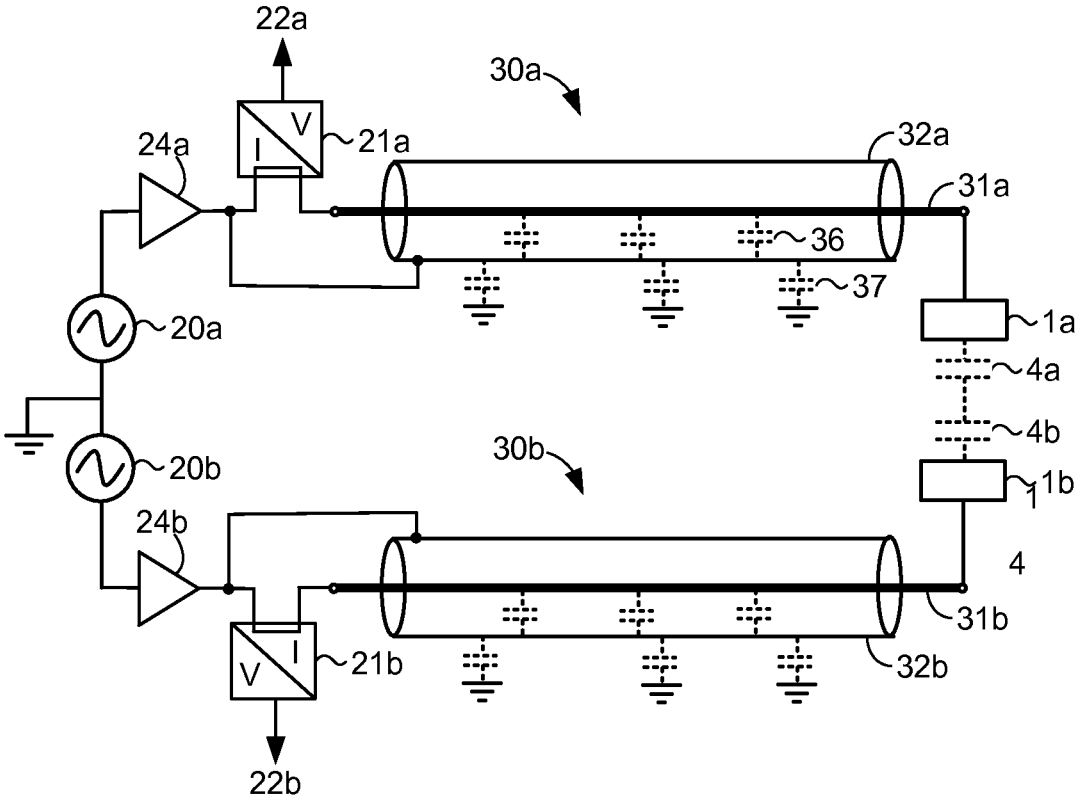
FIG. 4 is a diagram of a measurement circuit with a voltage source and shield driver driving both a sensor wire and shield conductor in a differential sensor pair arrangement.

The measurement error can be reduced by rearranging the circuit as shown in FIG. 4. This arrangement is for driving two capacitive sensors in a differential pair arrangement. For position measurement systems in which the target (or part of the target) is not a conductor or is otherwise isolated from ground, a second sensor and second measurement circuit with an inverted driver may be used in a differential pair arrangement such as shown in FIG. 4.

The output of voltage source 20a is connected to the input of shield driver 24a, the output of shield driver 24a is connected to one terminal of current measurement circuit 21a, and the other terminal of measurement circuit 21a is connected to sensor wire 31a. The same arrangement is used for voltage source 20b, shield driver 24b, current measurement circuit 21b, and sensor wire 31b. The Voltage sources 20a and 20b generate AC voltage waveforms phase offset by 180 degrees to each other. The target conducts the alternating current between the two sensors 1a and 1b through the two sensor capacitances 4a and 4b. The target behaves like a virtual ground for the two measurement systems; this is optimal if the sensor capacitances 4a and 4b are equal. The potential of the target will be removed as a common mode disturbance when the difference between the two current measurements 22a and 22b is calculated.

Moving the input of the shield driver to a point 'before' the current measurement omits the input capacitance of the shield driver from the capacitance measurement, thus eliminating this component of error from the measurement. This can also be viewed as a feed forward of the shield driver output to the shield conductor. The voltage source output is still transferred to the sensor wire, and is also directly connected to drive the shield conductor, instead of buffering the sensor wire voltage in order to load the shield conductor. Connecting the shield driver in series between the voltage source and measurement circuit has the additional benefit of removing error caused by deviation from unity gain of shield driver, because the shield driver output is connected to both the sensor wire (through the measurement circuit) and the shield conductor.

Figure 5:
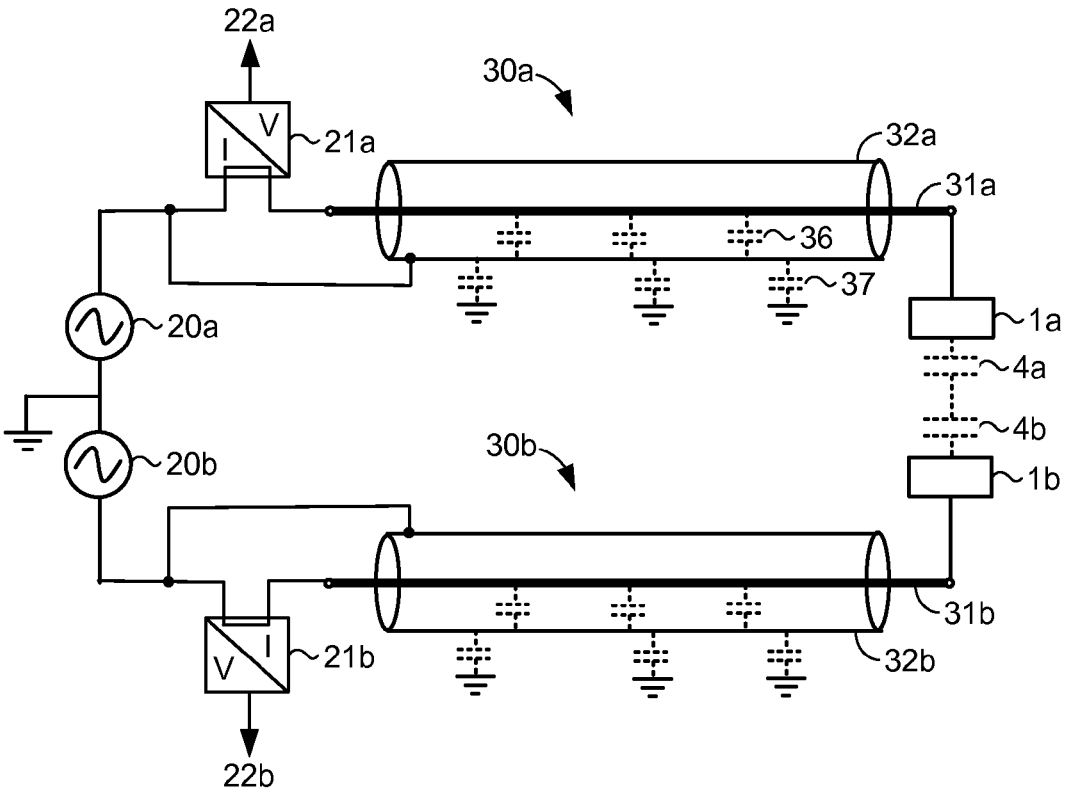
FIG. 5 is a diagram of a variation of the measurement circuit of FIG. 4 with shield drivers integrated into the voltage sources.

FIG. 5 shows a further refinement, with the same configuration as in FIG. 4 but with the separate shield driver 24a/24b omitted, this function being integrated with the voltage source 20a/20b to drive all capacitances in the system. This arrangement uses the same driver for both the sensor wire and shield conductor, and measures the current flowing in the sensor wire. The resulting system achieves simplicity while eliminating sources of measurement error present in conventional arrangements.

The arrangement of FIGS. 4 and 5 effectively eliminates any voltage difference between the sensor wire 31 and shield conductor 32 so that there is negligible voltage across the cable capacitance 36. This effectively eliminates current through the cable capacitance 36 and the current measured by circuit 21 is effectively only the current through the sensor capacitance 1. The input impedance of the current measurement circuit is made sufficiently low that the voltages supplied to the sensor wire and shield conductor are nearly equal.

Current through the capacitance 37 between the shield 32 and ground is supplied from the voltage source 20 or separate shield driver 24, and this current does not form part of the measured current and has only a second order effect on the voltage at the output of the voltage source. Any deviation from unity gain of the shield driver and the effect of input capacitance of the shield driver are both eliminated in this arrangement.

In effect the arrangement in FIGS. 4 and 5 results in driving the shield conductor 32 and coupling the shield to the sensor wire 31 so that the voltage on the sensor wire follows the voltage on the shield. This is the reverse of the conventional arrangement in which the sensor wire is driven and the voltage on the sensor wire is copied onto the shield conductor. In this design the focus is changed from being primarily directed to measuring the current through the sensor (and thereby measuring the sensor capacitance and distance value) while accounting for the current leakage due to the parasitic capacitances, to primarily focusing on providing a suitable environment for an accurate sensor current measurement by steering the shield conductor voltage, realizing this to be the main problem and measuring the sensor current to be a lesser problem.

Figure 6:
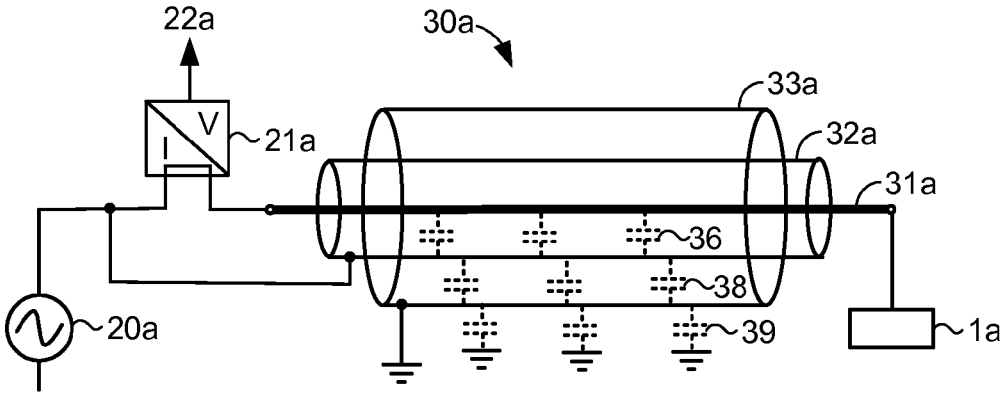
FIG. 6 is a diagram of a triaxial cable used for the measurement circuit of FIG. 4 or FIG. 5.

A grounded outer shield conductor may also be added to the configurations of FIGS. 4 and 5 to reduce interference from any nearby sources of noise. FIG. 6 shows a cable 30a with a grounded outer shield conductor 33a placed around the (inner) shield conductor 32a. The cable in this embodiment is a triaxial cable, the grounded shield 33a forming the outermost conductor. The grounded shield is preferably connected to a separate ground at the remote end of the cable, e.g. near the measurement circuit 21a. This ground is a shielding ground and is preferably not connected to any ground at the sensor. Interference with other nearby systems can be reduced using a grounded shield around each cable as described above, or by placing a single grounded shield around both cables 30a and 30b.

Figure 7A:
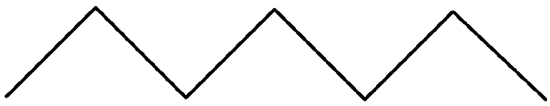
FIG. 7A is a diagram of triangular AC voltage waveform for driving a capacitive sensor.

Conventional capacitive sensing systems often drive the sensors using a current source and measure the resulting voltage across the sensor capacitance. The invention, e.g. in the configurations shown in FIGS. 4-6, uses a voltage source and a current measurement. The voltage source preferably generates an AC triangular voltage waveform having a constant peak amplitude, a constant frequency, and an alternating positive and negative slope of constant slope, as shown in FIG. 7A, although other waveforms may also be used. An amplitude of 5V peak-to-peak and frequency of 500 kHz are typical values. The voltage source preferably has a low output impedance to achieve a constant amplitude output under varying load conditions, and can be implemented, e.g., using a high current op-amp.

The shield driver may be implemented as an op-amp, preferably with low output impedance. The shield driver may be integrated into the voltage source for driving both the sensor wire and the shield conductor as described above.

Figure 7B:
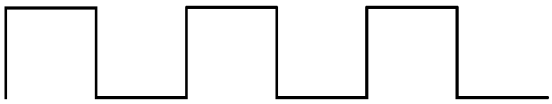
FIG. 7B is a diagram of an ideal AC current waveform resulting from the triangular voltage waveform of FIG. 7A.
Figure 7C:
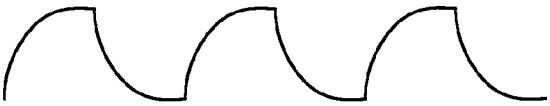
FIG. 7C is a diagram of a AC current waveform resulting in practice from the triangular voltage waveform of FIG. 7A.

An example of a triangular voltage source waveform is shown in FIG. 7A, which ideally produces a square-wave current waveform as shown in FIG. 7B, where the amplitude of the current waveform varies depending on the measured capacitance. In practice the triangular voltage waveform results in an imperfect current waveform more like the waveform shown in FIG. 7C. The current measurement circuit 21 may be configured to measure the amplitude of the current waveform near the end of each half-cycle at a portion of the waveform where the amplitude has stabilized, to reduce the effect of such variable imperfections in the current waveform. The current measurement circuit 21 may be a current-to-voltage converter, preferably with low input impedance, high accuracy, and low distortion.

Figure 8:
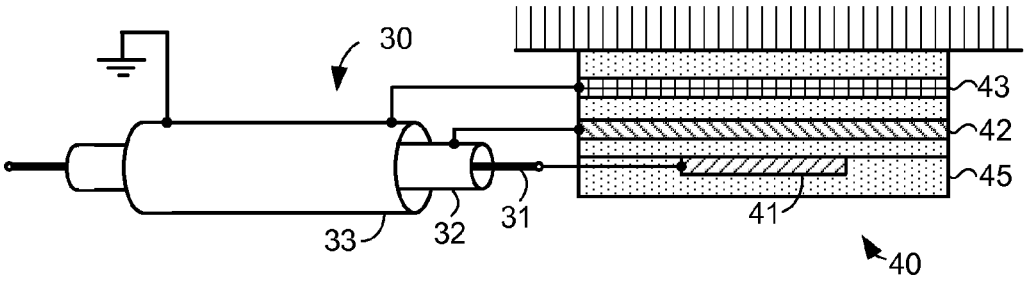
FIG. 8 is a cross sectional view of a thin film capacitive sensor connected to a triaxial sensor cable.

The capacitive sensor may be a conventional capacitive sensor or a thin film structure as described in U.S. patent application Ser. No. 12/977,240, which is hereby incorporated by reference in its entirety. FIG. 8 illustrates connections of a triaxial cable 30 to a capacitive sensor, in this example a thin film sensor 40 comprising electrodes 41, 42, 43 formed from thin film conductive layers with intervening thin film insulating layers 45. The sensor wire 31 is connected to the sensing electrode 41 of the sensor, the shield conductor 32 is connected to a back guard electrode 42, and the grounded outer shield conductor is connected to a shield electrode 43. A similar connection scheme may be used with a coaxial cable and with other types of sensors.

Figure 9A:
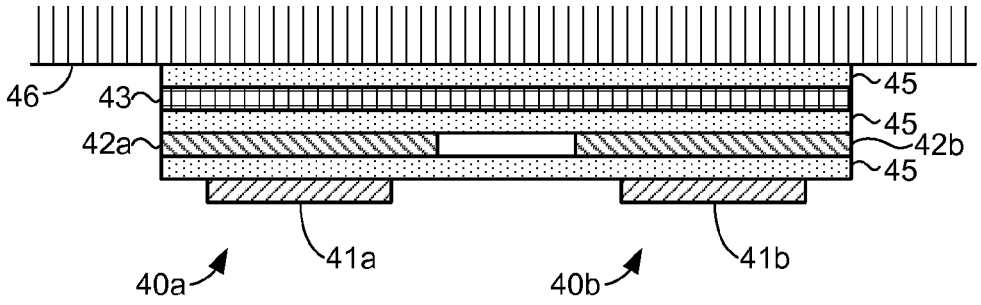
FIG. 9A is a cross sectional view of a thin film capacitive sensor pair.
Figure 9B:
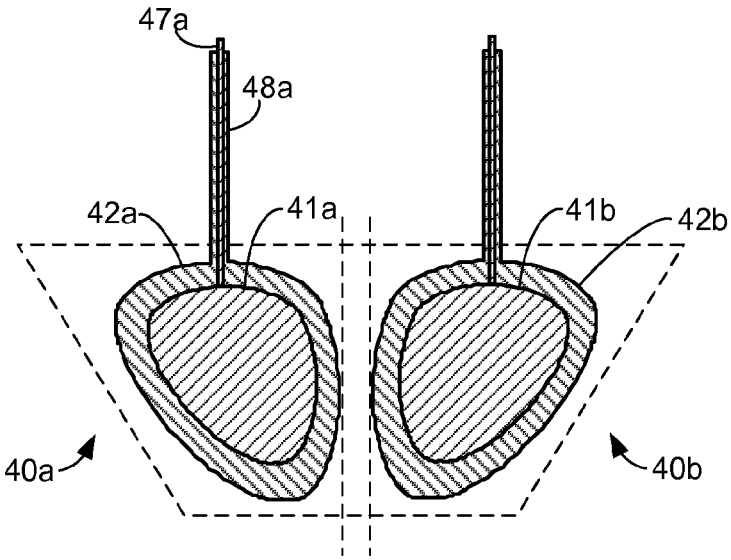
FIG. 9B is a top view of the thin film capacitive sensor pair of FIG. 9A.

FIGS. 9A and 9B show an example embodiment of a sensor pair constructed as a single integrated unit, which may be used as a differential sensor. In these embodiments, the integrated unit includes two sensors 40a and 40b, each having a separate sensing electrode 41a, 41b and a separate back guard electrode 42a, 42b. The two sensors of the sensor pair share a single shield electrode 43 integrated with the sensor pair, or alternatively a conductive plate 46 on which the sensor pair is fixed could serve as a shield electrode. The two sensors 40a, 40b are preferably operated as a differential pair as described herein, where each sensor is driven by a voltage or current which is out-of-phase from the other sensor of the pair, preferably 180 degrees out-of-phase, and a differential measurement is made to cancel out common mode errors.

FIG. 9B shows a top view of the sensor pair. The back guard and sensing electrodes are formed in a rounded quadrilateral shape designed to fit, e.g. in corner positions around a final lens element of a lithography machine. The electrodes may also be formed into circular shapes to produce large area sensing electrodes.

Many alternatives to the above arrangements are possible. For example, a coaxial, triaxial, or cable with four or more conductors may be used. A cable with one or more shield conductors in a non-coaxial arrangement may also be used, e.g. with the conductors arranged in a flat configuration with a central sensor wire with shield conductors on either side. The shield driver may be separate from or integrated in the voltage source. A single voltage source may be used to drive multiple sensors. This is particularly advantageous in the configurations with the shield driver integrated with the voltage source, greatly reducing the number of separate components used in the sensor system.

Some example calculations may be used to illustrate the improvement in the performance of the invention. For a sensor with a 4 mm sensing surface diameter at a nominal measuring distance of 0.1 mm results in a nominal sensor capacitance of approximately 1 pF. A cable of type RG178 and length five meters results in a cable capacitance between core and shield conductors of approximately 500 pF. A shield driver amplifier with a gain bandwidth factor of 100 MHz and measurement frequency of 1 MHz results in a gain of 0.99, i.e. with a deviation of 0.01 from unity gain. Using these example values, the steady-state performance of the configurations described above can be estimated. A conventional active shielding configuration as shown in FIG. 3 results in a capacitance measurement: 1 pF+(1−0.99)×500 pF=6 pF. This large error is usually compensated for by calibration of the combined system of sensor and cable. The configuration with combined driver for both the sensor wire and shield conductor as shown in FIGS. 4-6 results in a capacitance measurement: 1 pF+(1−1)×500 pF=1 pF. In this example, measurement errors of 500% are eliminated without requiring the combined sensor/cable system to be calibrated.

The performance of the configurations described above can also be estimated when an external disturbance causes a change in current in the shield conductor. For example, assuming a change in current in the shield conductor causes an additional 1% gain error in the shield driver, the conventional active shielding configuration as shown in FIG. 3 results in a capacitance measurement: 1 pF+(1−0.98)×500 pF=11 pF. Assuming the same 1% gain error in the shield/wire driver, the configuration with combined driver as shown in FIGS. 4-6 results in a capacitance measurement: 0.99×(1 pF+(1−1)×500 pF=0.99 pF. The represents an error deviation of 0.01 pF, which is only 1%. Sensitivity for cable length/load is reduced to about 1%.

Figure 10:
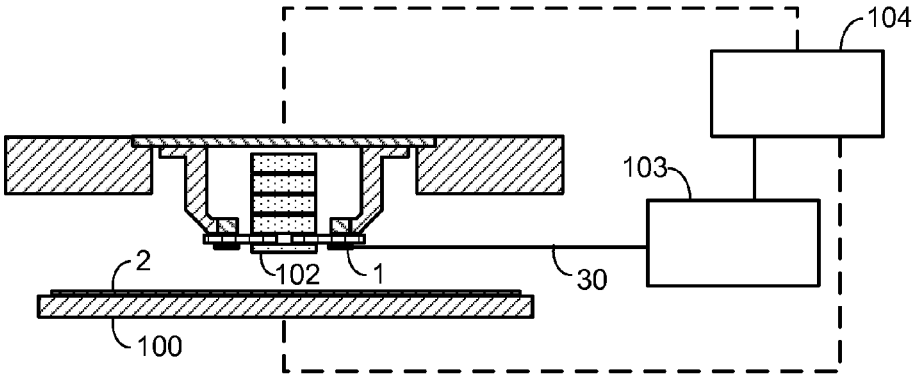
FIG. 10 is a simplified diagram of capacitive sensors and measurement circuit implemented for distance measurement in a charged particle lithography machine.

FIG. 10 shows a simplified diagram of capacitive sensors 1 and a measurement circuit 103 implemented for distance measurement in a charged particle lithography machine. The lithography machine generates charged particle beams for exposing a target 2 such as a silicon wafer, mounted on a stage 100 moveable in horizontal and vertical directions. The capacitive sensors are mounted onto a plate close to the final element of the projection lens 102 of the lithography machine, arranged to measure the distance from the projection lens element to the surface of the wafer to be exposed. The sensors are connected via cable 30 to measurement system 103, which may include the voltage source 20 and current measurement circuit 21 in any of the configurations described herein. The measurement system 103 generates a current measurement signal which is communicated to control system 104 which, on the basis of the measurement signal, controls the movement of the stage 100 to bring the target 2 to a desired distance from the projection lens of the lithography machine.

Figure 11:
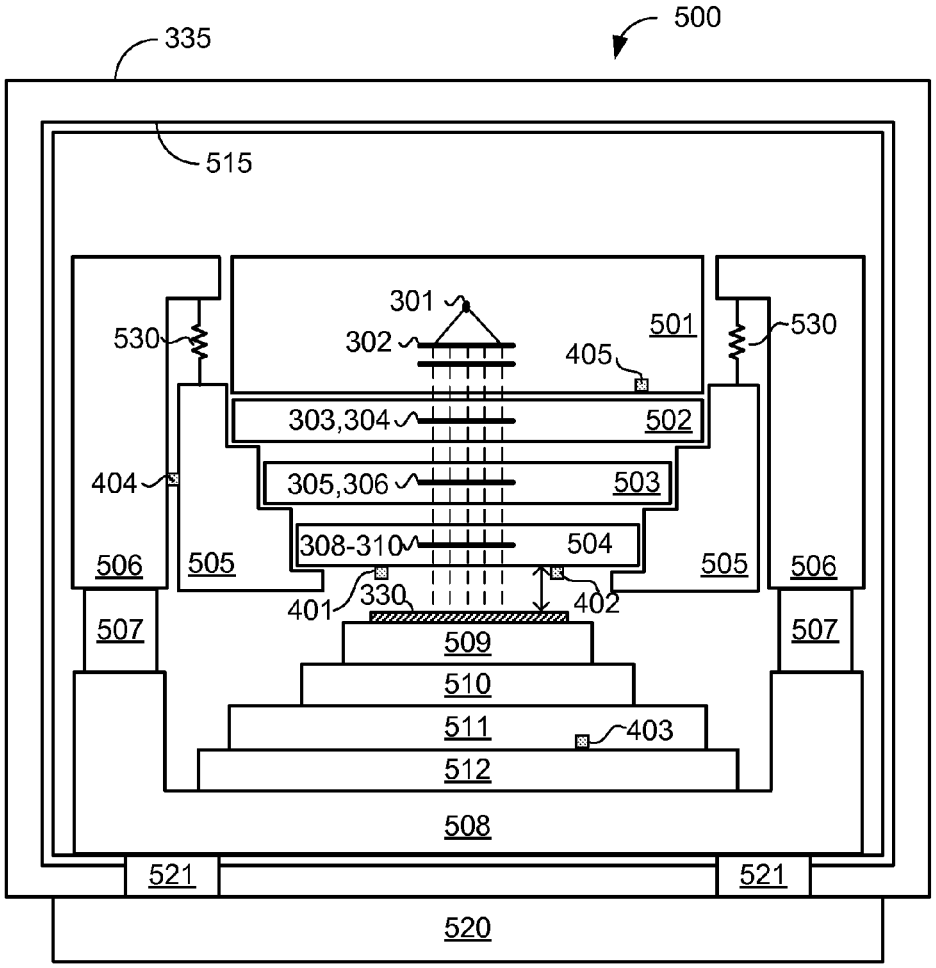
FIG. 11 is a simplified view of a modular lithography system with multiple sets of thin film capacitive sensors for position measurement of movable parts.

FIG. 11 shows a simplified block diagram illustrating the principal elements of a modular lithography apparatus 500. The lithography apparatus 500 is preferably designed in a modular fashion to permit ease of maintenance. Major subsystems are preferably constructed in self-contained and removable modules, so that they can be removed from the lithography apparatus with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 11, these modular subsystems include an illumination optics module 501 including a charged particle beam source 301 and beam collimating system 302, an aperture array and condenser lens module 502 including aperture array 303 and condenser lens array 304, a beam switching module 503 including a multi-aperture array 305 and beamlet blanker array 306, and projection optics module 504 including beam stop array 308, beam deflector array 309, and projection lens arrays 310. The modules are designed to slide in and out from an alignment frame. In the embodiment shown in FIG. 11, the alignment frame comprises an alignment inner subframe 505 suspended via vibration damping mounts 530 from an alignment outer subframe 506. A frame 508 supports the alignment subframe 506 via vibration damping mounts 507. The target or wafer 330 rests on substrate support structure 509, which is in turn placed on a chuck 510. The chuck 510 sits on the stage short stroke 511 and long stroke 512 arranged to move the stage in various horizontal and vertical directions. The lithography machine is enclosed in vacuum chamber 335, which may include a mu metal shielding layer or layers 515, and rests on base plate 520 supported by frame members 521.

In the embodiment shown in FIG. 11, five sets of capacitive sensors are used to measure position or distance of various elements in the lithography machine. Sensor set 401 is arranged to measure distance between the final lens element and the target 330, as shown e.g. in FIG. 10. Sensor set 402 is arranged to measure distance between an optical alignment sensor mounted near the final lens element and the target 330 or chuck 510, to facilitate focusing of the alignment sensor beam for alignment of the target and stage. Sensor set 403 is arranged to measure the position of the short stroke stage 511 in horizontal (X, Y-axis) and vertical (Z-axis) positions by measuring distances with respect to the long stroke stage 512. Sensor set 404 is arranged for measuring position of the suspended subframe 505 with respect to alignment subframe 506 in horizontal and vertical positions by measurement with respect to the subframe 505. Sensor set 405 is arranged for measuring position of the illumination optics module 501 in horizontal and vertical positions by measurement with respect to the subframe 505.

The capacitive sensors used in any of the applications shown in FIGS. 10 and 11 are preferably thin film sensors, and may also be arranged in pairs for differential operation. The sensors may be of the type shown in FIG. 8, preferably connected to the cable 30 using the arrangement shown in FIG. 8. The sensors may also be constructed with multiple sensing electrodes on a signal substrate, such as the sensor pair shown in FIG. 9A, 9B. Use of a thin film construction enables the sensors to be constructed at low cost, and enables the sensors to be placed in narrow spaces and on parts of the lithography machine not suitable for conventional sensors with larger dimensions. Operating the sensors in a differential mode enables use of the sensors for measurement of distance to an opposing surface that is not grounded, and does not require a return electrical connection from the opposing surface to the measurement system. The latter factor is advantageous in applications where the sensor is arranged to measure distance to a movable part, where it is difficult or disadvantageous to make an electrical connection to the moveable part for the sensing system.

These sets of sensors may be arranged in sets of six sensors to from three differential sensor pairs, for measurement in three axes, i.e. horizontal X, Y-axes and vertical Z-axis directions. This may be accomplished by mounting the differential sensor pairs oriented for measuring distance to each direction to a suitable opposing surface. Measurement signals from the sensors may be sued to adjust the position of moveable parts of the lithography machine, e.g. using a piezomotor to make small movements to obtain proper alignment of the part within the system.

Figure 19:
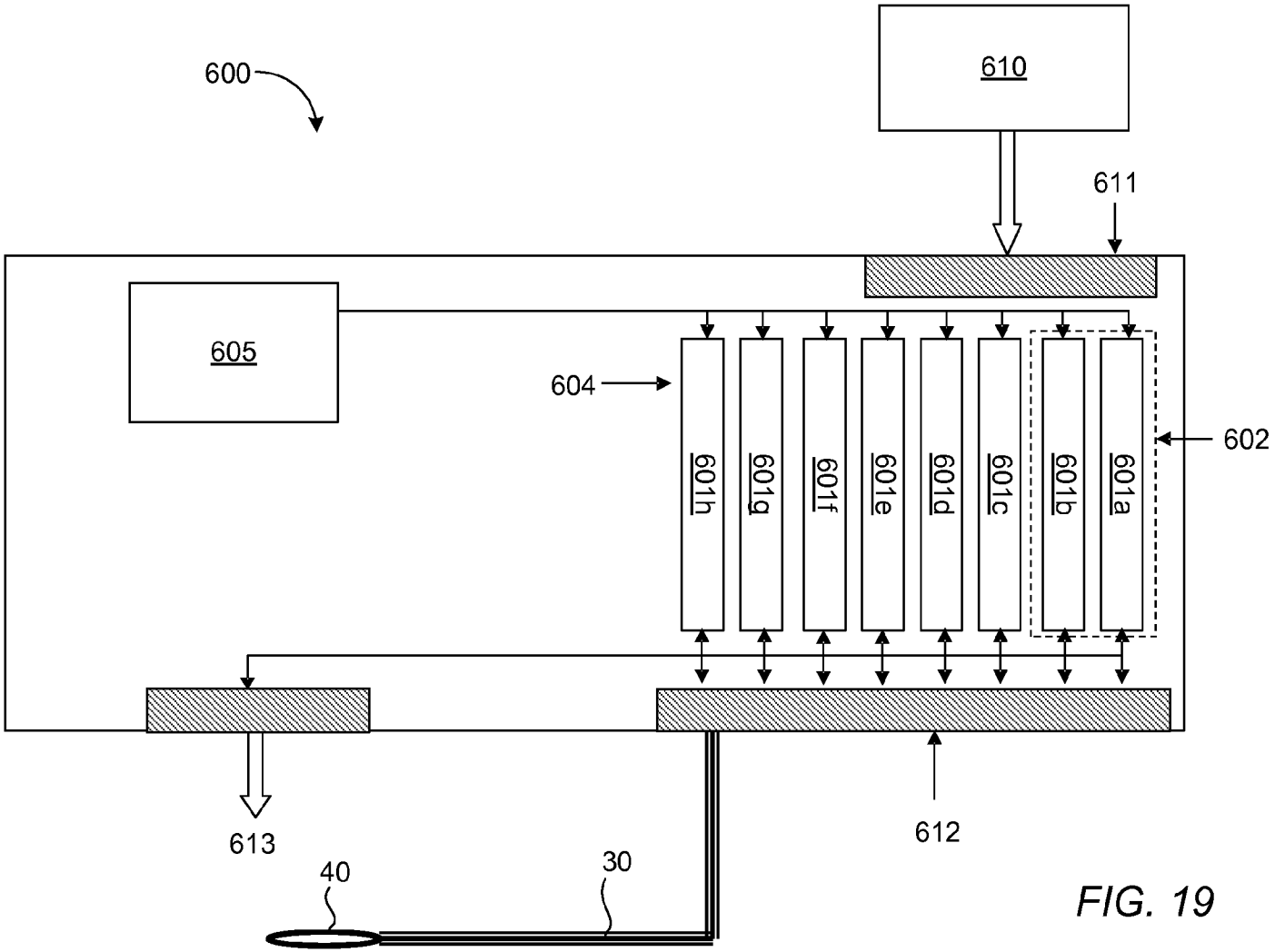
FIG. 19 is a simplified block diagram of layout of electronic circuits for a current measurement system.

Each set of sensors is connected via a cable 30 to a corresponding current measurement circuit located in a cabinet outside the vacuum chamber and remote from the lithography machine. FIG. 19 shows an embodiment of a cabinet 600 housing circuit boards 601. Each circuit board 601 provides the current measurement circuits for a capacitive sensor 40, a pair of circuit boards 602 providing the current measurement circuits for a differential sensor pair. A signal generator 605 provides the AC voltage signal for energizing the capacitive sensors, e.g. a triangular voltage waveform from voltage source 20 as described herein. Each circuit board is connected via connector 612 and cable 30 to a thin film capacitive sensor 40. Current measurement output signals are output via another connector to analog-to-digital converter 613 for conversion to digital signals for use in controlling the lithography machine. Power supply 610 provides power to the circuit boards via power supply connector 611.

The current measurement circuits 21, 21a, 21b may be implemented, for example, as a current-to-voltage converter or a current-to-current converter. There are several factors which contribute to errors in such measurement circuits. These include stray impedance in the input circuitry of the measuring circuit, a limited common mode rejection ratio (CMRR) of the input circuitry, and inaccuracy on the transfer function of the measurement circuit independent of common mode.

Figure 12:
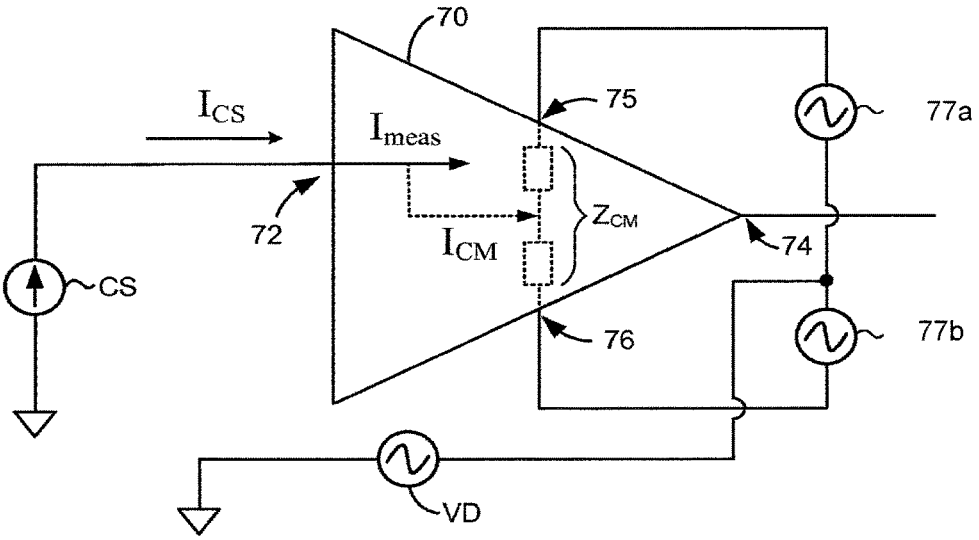
FIG. 12 is a simplified functional diagram of a current measuring circuit with an input voltage disturbance fed into the power supply.

FIG. 12 is a functional schematic diagram of a current measuring circuit 70. The input current $I_{CS}$ at input terminal 72 from an AC or DC current source CS is to be measured by the circuit. A portion of the current $I_{CS}$ is diverted in the input circuitry of the measuring circuit, this portion represented by current $I_{CM}$. Voltage disturbances on the input terminal 72 relative to the power supply voltages of the circuit cause variation in current $I_{CM}$ flowing through the internal impedance $Z_{CM}$. As a result, the current $I_{meas}$ actually measured by the circuit is slightly less than the input current $I_{CS}$ desired to be measured, leading to a small error in the measurement. The current $I_{CM}$ results from stray impedances in the input circuitry and common mode disturbances in the input signal. A steady-state error can be corrected, but it is very difficult to compensate for the current flow $I_{CM}$ because the value of the stray impedance is variable, depending on factors such as temperature, and common mode disturbances on the input also vary with time.

These measurement errors can be reduced by driving the supply voltages with the same voltage present at the input terminal of the measurement circuit. In this way, the disturbances on the input are transferred to the supply voltages to reduce or eliminate currents flowing in the measuring circuit caused by varying voltage differences between the input signal and internal circuits in the measuring circuit.

The voltage supply terminals 75 and 76 of the current measuring circuit are connected to a power supply comprising voltage sources 77a, 77b. A voltage source VD is provided to feed voltage disturbances at the input terminal into the power supply, to that voltage differences between the input signal and the measuring circuit supply voltages remain constant. The voltage source VD is connected to the measuring circuit power supply, so that the power supply voltages are also driven by any voltages present at the input terminal of the measuring circuit. The voltage source VD may be provided by suitable feedback or feed forward in the circuit.

Figure 13:
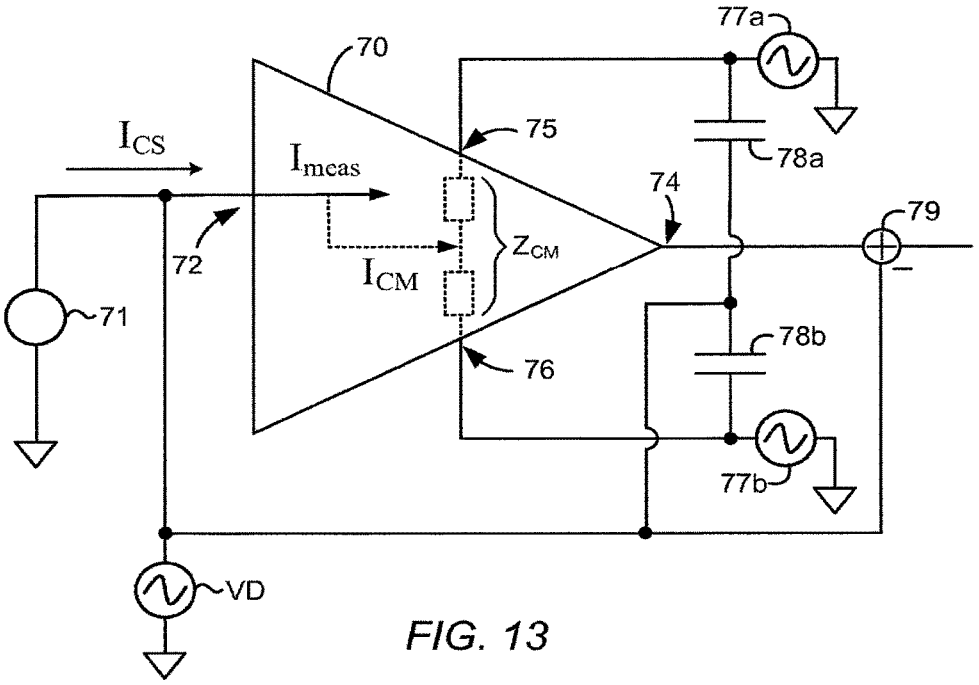
FIG. 13 is a simplified diagram of the current measuring circuit of FIG. 12 with a load driven by a voltage source.

FIG. 13 is a functional schematic diagram showing the current measuring circuit of FIG. 12 where the voltage source VD is used to energize a load 71. Driving the load 71 with the voltage source VD results in current $I_{CS}$ which is the current measured at the input terminal 72 of the circuit. Thus, the disturbance voltage VD which is coupled to the power supply of the current measuring circuit is the voltage which drives the load 71 to produce the current $I_{CS}$ to be measured. Feeding the disturbance voltage into the power supply of the current measuring circuit results in removing the varying voltage differences within the current measuring circuit caused by the disturbance voltage. This removes a source of error in the current measurement.

In the embodiment shown in FIG. 13, the disturbance voltage VD is also subtracted from the output of the current measuring circuit 70 by a difference circuit 79. The output signal at the output terminal 74 of the current measuring circuit 70 will have the disturbance voltage VD superimposed on the signal resulting from measuring the input current $I_{CS}$. Subtracting the disturbance voltage VD thus may be used to isolate the portion of the output signal representing the input current measurement.

The embodiment in FIG. 13 shows two power supply terminals powered by two voltage sources 77a, 77b, typically supplying a positive and a negative DC voltage to positive and negative power supply terminals. A single power supply terminal and/or a single power supply voltage source may be used instead. In this embodiment, the disturbance voltage is fed via capacitors 78a, 78b to the power supply terminals so that the AC component of the disturbance voltage is fed to the power supply terminals while the DC component of the power supply voltages are isolated from the input terminal 72 and the voltage source VD. Inductors may also be used to isolate the AC component of the disturbance voltage from the power supply voltages, such as inductors 95, 96 shown in the embodiment in FIG. 15.

Figure 14:
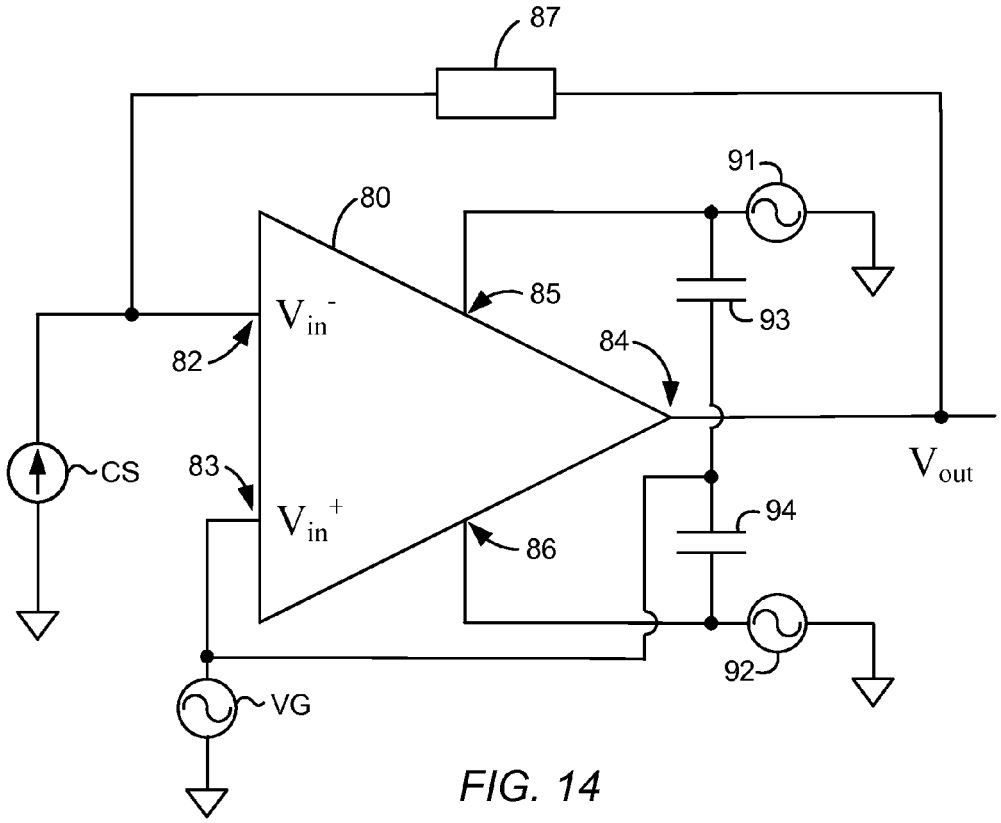
FIG. 14 is a simplified diagram of a current measuring circuit implemented with an operational amplifier.

FIG. 14 is a diagram showing an embodiment of the current measuring circuit implemented with an operational amplifier 80 (referred to as an opamp). A current source CS is connected to a negative terminal 82 of the opamp 80, and a positive input terminal 83 of the opamp is connected to common. The opamp 80 has two power terminals 85 and 86, through which the operational amplifier 80 can be energized by the two voltage sources 91 and 92.

The current source CS produces a current Ics to be measured. An impedance 87 connected between the input terminal 82 and the output terminal 84 provides negative feedback, and the opamp 80 operates to maintain the voltage difference between the two input terminals 82 and 83 at nearly zero. The opamp 80 has a very high input impedance so that very little of the current Ics flows into the opamp, but instead flows through impedance 87. However, due to stray impedances in the input circuitry of the opamp 80 and a limited CMRR of the opamp, the opamp 80 cannot completely eliminate the influences of common mode voltages on the inputs.

In the embodiment shown, an AC voltage supply VG is used to drive the input terminal 83. Because the opamp 80 is configured to maintain the two input terminals 82 and 83 at almost the same voltage, the voltage VD effectively represents a common mode disturbance on the input terminals. The output of the voltage source VD, connected to the input terminal 83, is also connected to the opamp power supply circuit to feedforward the common mode disturbance voltages into the power supply voltages of the opamp 80. In this embodiment, the output of the voltage source VD is connected via capacitors 93, 94 to couple the voltage at input terminal 83 to the voltage supply to power supply terminals 85, 86. In this way, DC voltage sources 91, 92 supply a DC voltage to power supply terminals 85, 86 while AC voltages present at input terminal 83 are also supplied to the power supply terminals 85, 86. Inductors 95, 96 may also be included in the power supply as shown in the embodiment in FIG. 15 to provide some isolation between the AC components of the feedforward input terminal voltage and the DC voltage sources 77a, 77b; 91, 92.

Figure 15:
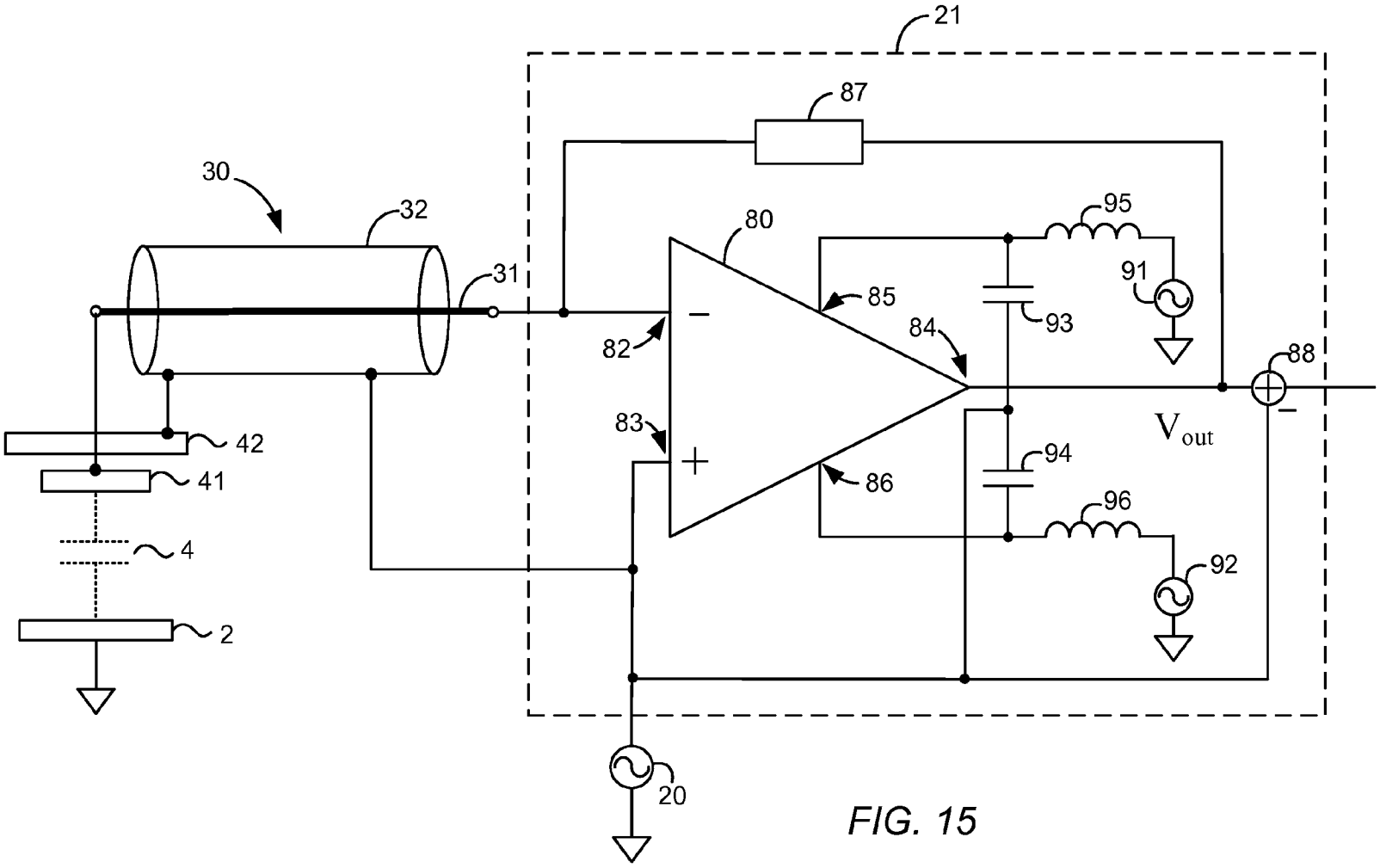
FIG. 15 is a simplified diagram of the current measuring circuit of FIG. 14 for measuring current from a capacitive sensor.

FIG. 15 shows an example of the embodiment of FIG. 14 used for measuring current in a capacitive sensor system, such as shown in any of FIGS. 3-6. The current to be measured is transferred to the current measuring circuit 21 via cable 30, as the current measuring circuit 21 is typically located remotely from the capacitive sensor. The capacitive sensor may be a thin film capacitive sensor such as shown in FIGS. 8 and 9. The cable 30 comprises a sensor wire 31 and a shield conductor 32 and has a remote end and a local end. The sensor wire 31 is electrically connected to the capacitive sensor electrode 41 at the local end of the cable 30, and the shield conductor 32 is electrically connected to the capacitive sensor guard electrode 42 at the local end of the cable 30.

The voltage source 20 energizes the shield conductor 32 at the remote end of the cable 30 to energize the guard electrode 42. The voltage source 20 also energizes the sensor wire 31 via the opamp 80 to energize the sensing electrode 41 of the capacitive sensor. Because the opamp maintains the voltages at its input terminals 82, 83 at essentially the same voltage, the sensor wire 31 and shield conductor 32 are also energized at essentially the same voltage, virtually eliminating capacitive leakage current between them.

The output terminal of the voltage source 20 is connected to input terminal 83, the shield conductor 32, and is also connected to the power supply for the opamp 80 as described earlier, and is connected to a difference circuit 88 to subtract the signal from the voltage source 20 from the output signal of the opamp 80.

Figure 16A:
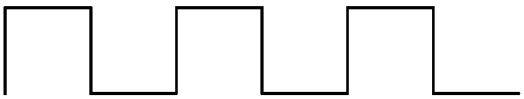
FIGS. 16A-C are waveform diagrams of signals for the current measuring circuit of FIGS. 13-15.
Figure 16B:
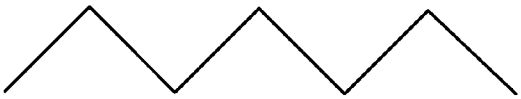
Figure 16C:
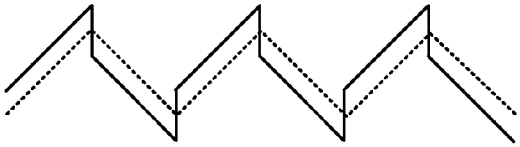

The voltage source preferably provides a triangular voltage signal to drive the capacitive sensor, as described earlier. This results (ideally) in a square-wave current signal shown in FIG. 16A, as described earlier. The triangular voltage output by the voltage source 20 is present on input terminals 83 and 82 of the opamp 80, as shown in FIG. 16B. The output voltage Vout at the output terminal 84 of the opamp 80 will include the triangular voltage present at the input terminals with a square-wave superimposed due to the square-wave current flowing through the feedback impedance 87, as shown in FIG. 16C. In order to obtain a measurement signal with the same square-wave waveform as the current generated at the capacitive sensor, the triangular voltage waveform from the voltage source 20 is subtracted by the difference circuit 88 from the signal at the output terminal 84.

Figure 17:
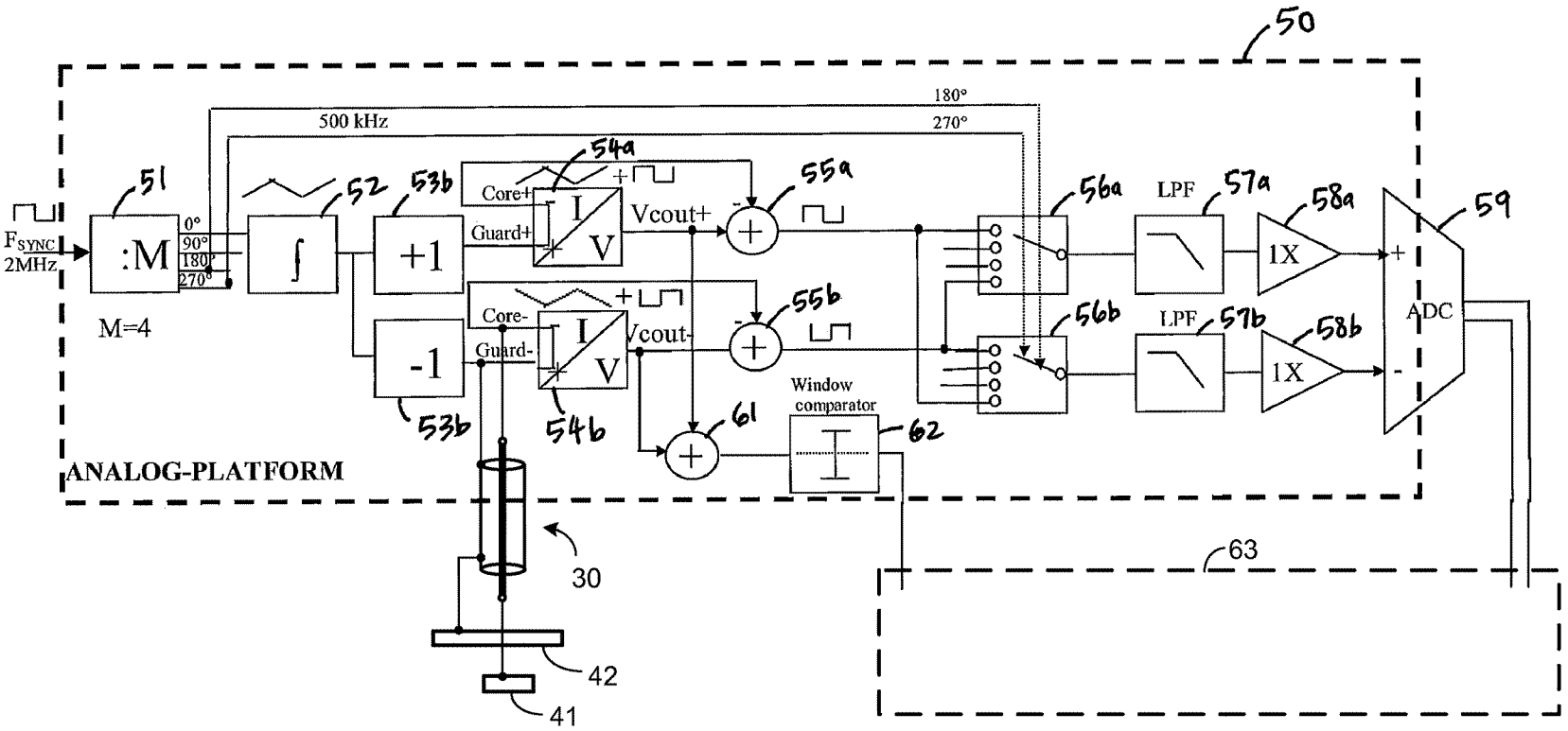
FIG. 17 is a simplified circuit diagram of one embodiment of a current measurement system.

FIG. 17 shows an embodiment of a voltage source and current measurement circuit for a differential pair sensing system such as described herein. This circuit could also be used for single sensors not operating as a differential pair. The circuitry is divided into an analog signal processing portion 50, and a digital signal processing portion 63 which may be implemented e.g. in a field programmable gate array.

Figures 1B, 18A, 18B, 18D, 18E, 18F, 18G, 18H, 18I, 18J, 18K:
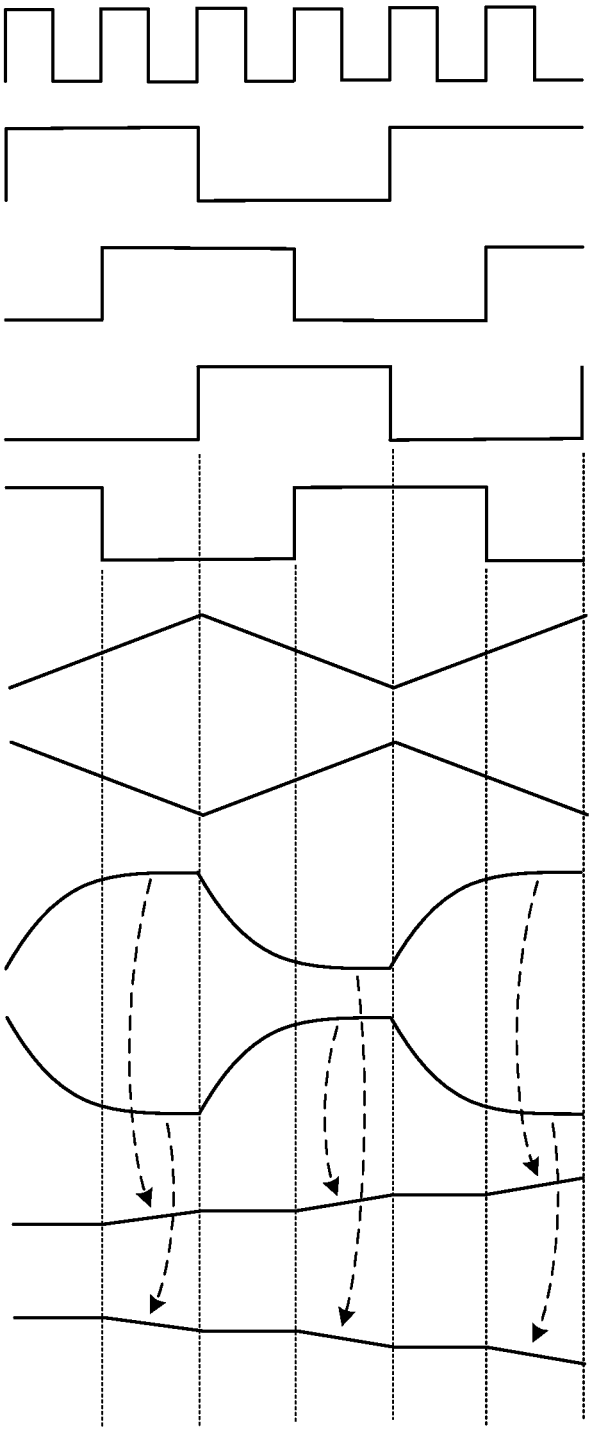

A frequency reference $F_{SYNC}$ is generated (e.g. at 2 MHz) and divided in divider circuit 51 to generate multiple separate square-wave signals at a lower frequency with certain predetermined phase offsets. In this embodiment, four separate 500 kHz square-wave signals are generated with 90 degree phase offsets. FIG. 18A shows an example of square wave frequency reference signal, and FIGS. 18B-18E show example waveforms of lower frequency signals with 0, 90, 180 and 270 degree phase shifts.

Integrator circuit 52 generates a triangular voltage waveform from one of the square-wave signals, and from this the amplifier circuits 53a and 53b generate two triangular voltage waveforms 180 degrees out-of-phase. For example, these two out-of-phase triangular voltage waveforms may correspond to the outputs of voltage sources (e.g. 20, 20a, 20b, VD) shown in any of FIG. 3-6, 13, 14 or 16 for driving a single capacitive sensor or load or two sensors/loads operated in a differential pair. FIGS. 18F and 18G show an example of triangular waveform outputs from amplifier circuits 53a and 53b. The triangular voltage signals may be connected to energize the shield conductors 32, 32a, 32b, and also the sensor wires 31, 31a, 31b via current-to-voltage converters 54a and 54b, for energizing the capacitive sensors or loads 40, 40a, 40b, 71 as shown in FIG. 3-6, 13, 14 or 16.

The current-to-voltage converters 54a and 54b generate voltage signals at their outputs representing a measurement of the current signals at their inputs (i.e. the output signals 22, 22a, 22b, 74, 84 of FIG. 3-6, 13, 14 or 16). The triangular voltage waveforms from the amplifier circuits 53a, 53b are subtracted from the measured current signals at the outputs of the current-to-voltage converters 54a, 54b by difference circuits 55a, 55b to remove the triangular voltage signal from the current-to-voltage converter output signals, to isolate the measured input current signal. FIGS. 18H and 18I show examples of the resulting measured current signal waveforms at the output of the difference circuits 55a, 55b.

Selectors 56a, 56b use one or more of the phase shifted reference signals generated by divider circuit 51, e.g. 180 and 270 degree shifted reference signals shown in FIGS. 18D and 18E, to sample a portion of each cycle of the measured current signals shown in FIGS. 18H and 18I. The second half of each cycle of the measured current signals is sampled to obtain the amplitude for the portion of the cycle when it is generally steady-state at the maximum amplitude value.

When the circuit is used with a sensor pair operated in differential mode, the sampling may be performed to switch between the two measured current signals, to accumulate the positive amplitudes in one signal (FIG. 18J) and the negative amplitudes in the other signal (FIG. 18K). Low pass filters 57a, 57b filter the sampled measured current signals to implement an equivalent of a capacitor charging circuit with slope determined by the amplitude of the sampled portion of the measured current signal waveform.

Example waveforms at the output of amplifiers 58a, 58b are shown in FIGS. 18J and 18K. The waveforms rise (or fall) during each sampled period, the end values determined by the amplitude of the measured current signals. The outputs from the amplifiers 58a, 58b are subtracted from each other and the resulting signal is converted to a digital signal by analog-to-digital converter 59. The resulting digital signal is output to the digital signal processing circuitry 63 for further processing such as calibration adjustment and scaling to result in a useable measurement indicative of the sensor capacitance. Adder 61 and window comparator 62 generate an error signal for use in the digital signal processing circuitry 63 for situations such as a cable short or open fault.

The invention has been described by reference to certain embodiments discussed above. It should be noted various constructions and alternatives have been described, which may be used with any of the embodiments described herein, as would be known to those of skill in the art. In particular, the current measuring circuits described in relation to FIGS. 12-14 may be used in any application requiring precise measurement of current, and the signal processing circuits described in relation to FIG. 17 may be used for any application requiring isolation of an amplitude signal in an alternating signal. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A measurement system for measuring an input electrical current from a current source and generating a current measurement signal, comprising a current measuring circuit having a first input terminal connected to the current source for receiving the input electrical current from the current source and an output terminal for providing the current measurement signal, wherein the current measuring circuit further comprises one or more power supply terminals arranged to receive one or more voltages from a power supply for powering the current measuring circuit, and wherein the current measuring circuit further comprises a first voltage source coupled to the one or more power supply terminals, the first voltage source [providing] *is configured to provide* a disturbance voltage to the one or more power supply terminals, the disturbance voltage representing a voltage at the first input terminal, wherein the first input terminal, the output terminal and the one or more power supply terminals are distinct, wherein the current source, the power supply and the first voltage source are distinct, and wherein the measurement circuit is configured to drive the one or more power supply voltages with a voltage essentially the same as a voltage present at the first input terminal by feeding the disturbance voltage to the one or more power supply terminals.

2. The measurement system of claim 1, further comprising a difference circuit arranged to subtract a voltage generated by the first voltage source from a signal at the output terminal of the current measuring circuit to generate the current measurement signal.

3. The measurement system of claim 1, wherein the first voltage source is connected to the first input terminal of the current measuring circuit for driving a load to form the current source.

4. The measurement system of claim 3, wherein the load comprises a capacitive sensor for generating a current which varies in dependence on distance between the capacitive sensor and a target.

5. The measurement system of claim 3, wherein the load is connected to the first input terminal of the current measuring circuit by a cable comprising a sensor wire and a shield conductor, wherein the sensor wire is connected in series between the load and the first input terminal and the shield conductor is connected to the first voltage source.

6. The measurement system of claim 1, wherein an output terminal of the first voltage source is coupled via one or more capacitors to the one or more power supply terminals of the current measuring circuit.

7. The measurement system of claim 1, wherein the current measuring circuit comprises a current-to-voltage converter.

8. The measurement system of claim 1, wherein the current measuring circuit comprises an operational amplifier, a negative input terminal of the operational amplifier serving as the first input terminal of the current measuring circuit and an output terminal of the operational amplifier serving as the output terminal of the current measuring circuit, the operational amplifier further comprising a positive input terminal and one or more power supply terminals, wherein the positive input terminal of the operational amplifier is electrically connected to the one or more power supply terminals of the operational amplifier.

9. The measurement system of claim 8, wherein the positive input terminal of the operational amplifier is electrically connected to the one or more power supply terminals of the operational amplifier via one or more capacitors.

10. The measurement system of claim 1, wherein the first voltage source generates a voltage with a triangular waveform.

11. The measurement system of claim 1, wherein the current source generates a current with a substantially square waveform.

12. A method for measuring an input electrical current from a current source and generating a current measurement signal, comprising:

providing the input electrical current from the current source to a first input terminal of a current measuring circuit, the current measuring circuit having one or more power supply terminals arranged to receive one or more power supply voltages from a power supply for powering the current measuring circuit, and providing a disturbance voltage from a voltage source to the one or more power supply terminals, the disturbance voltage representing a voltage at the first input terminal, hence driving the one or more power supply voltages with a voltage essentially the same as a voltage present at the first input terminal, and generating an output signal at an output terminal of the current measuring circuit representing the input electrical current at the first input terminal of the current measuring circuit, wherein the first input terminal, the output terminal and the one or more power supply terminals are distinct, and wherein the current source, the power supply and the first voltage source are distinct.

13. The method of claim 12, further comprising subtracting the disturbance voltage from the output signal at the output terminal of the current measuring circuit to generate the current measurement signal.

14. The method of claim 12, further comprising driving a load with a voltage to generate the input electrical current at the first input terminal of the current measuring circuit.

15. The method of claim 14, wherein the load comprises a capacitive sensor for generating a current which varies in dependence on distance between the capacitive sensor and a target.

16. The method of claim 14, further comprising connecting the load to the first input terminal of the current measuring circuit by a cable comprising a sensor wire and a shield conductor, wherein the sensor wire is connected in series between the load and the first input terminal and the shield conductor is energized with substantially the same voltage used to drive the load.

17. The method of claim 12, wherein the disturbance voltage is provided to the one or more power supply terminals via one or more capacitors.

18. The method of claim 12, wherein the disturbance voltage is isolated from the power supply voltages by one or more inductors.

19. The measurement system of claim 1, wherein the current measurement circuit is coupled to a cable comprising a sensor wire and a shield conductor, wherein the sensor wire is coupled to the first input terminal and the shield conductor is coupled to the first voltage source.

20. The measurement system of claim 19, wherein the cable is connected to a capacitive sensor at an end of the cable remote from the measurement circuit, the capacitive sensor comprising a sensor electrode and a guard electrode, wherein the sensor electrode is electrically connected to the sensor wire and the guard electrode is electrically connected to the shield conductor.

21. The measurement system of claim 1, wherein the power supply for powering the current measurement circuit is arranged to supply a DC voltage to the one or more power supply terminals.

22. The measurement system of claim 1, wherein the disturbance voltage is an AC voltage.

23. The measurement system of claim 1, wherein one or more inductors are provided between the power supply and the first voltage source for isolating the disturbance voltage from the one or more voltages from the power supply.

24. The measurement system of claim 1, wherein the first voltage source is further coupled to a second input terminal of the current measurement circuit.

25. The measurement system of claim 1, wherein the current measurement system comprises an operational amplifier and wherein the first input terminal, the output terminal and the one or more power supply terminals are terminals of the operational amplifier.

*26. An inspection tool comprising:*

*a measurement system configured to measure an input electrical signal from a capacitive sensor and to generate a current signal, the measurement system comprising:*

*a circuit comprising:*

*a first input terminal connected to the capacitive sensor and configured to receive the input electrical current from the capacitive sensor;*

*one or more power supply terminals arranged to receive one or more power supply voltages from a power supply configured to power the circuit;*

*a first voltage source coupled to the one or more power supply terminals and configured to provide a disturbance voltage to the one or more power supply terminals, the disturbance voltage representative of a voltage at the first input terminal; and*

*an output terminal configured to provide the current signal,*

*wherein the circuit is configured to drive the one or more power supply voltages with a voltage essentially the same as a voltage present at the first input terminal by directing the disturbance voltage to the one or more power supply terminals,*

*wherein the first input terminal, the output terminal, and the one or more power supply terminals are distinct, and*

*wherein the capacitive sensor, the power supply, and the first voltage source are distinct.*

*27. The inspection tool of claim 26, wherein the first voltage source is coupled to the first input terminal and is configured to drive the capacitive sensor.*

*28. The inspection tool of claim 26, further comprising a projection system having a lens.*

*29. The inspection tool of claim 28, further comprising a stage configured to support a substrate.*

*30. The inspection tool of claim 29, wherein the capacitive sensor is configured to generate the input electrical current dependent on the distance corresponding to the projection system and the stage and/or substrate.*

*31. The inspection tool of claim 29, wherein the disturbance voltage is representative of a change in distance corresponding to the projection system and an opposing surface of the substrate and/or the stage.*

*32. A capacitive measurement system configured to measure an input electrical signal from a capacitive sensor and to generate a current signal, the capacitive measurement system comprising:*

*a first input terminal connected to the capacitive sensor and configured to receive the input electrical current from the capacitive sensor;*

*one or more power supply terminals arranged to receive one or more power supply voltages from a power supply;*

*a first voltage source coupled to the one or more power supply terminals and configured to provide a disturbance voltage to the one or more power supply terminals, the disturbance voltage representing a voltage at the first input terminal; and*

*an output terminal configured to provide the current signal,*

*wherein the one or more power supply voltages are driven with a voltage essentially the same as a voltage present at the first input terminal by directing the disturbance voltage to the one or more power supply terminals,*

*wherein the first input terminal, the output terminal, and the one or more power supply terminals are distinct, and*

*wherein the capacitive sensor, the power supply, and the first voltage source are distinct.*

* * * * *